(12) United States Patent
Yang et al.

(10) Patent No.: US 9,726,731 B2
(45) Date of Patent: Aug. 8, 2017

(54) BATTERY PACK, METHOD FOR DETECTING BATTERY PACK, CHARGING ASSEMBLY AND ELECTRIC TOOL

(71) Applicant: CHERVON INTELLECTUAL PROPERTY LIMITED, Road Town (VG)

(72) Inventors: Dezhong Yang, Nanjing (CN); Pingbo Shi, Nanjing (CN); Lei Liu, Nanjing (CN); Zheng Geng, Nanjing (CN); Lei Wang, Nanjing (CN); Junya Duan, Nanjing (CN); Yingdian Xiang, Nanjing (CN)

(73) Assignee: Chervon (HK) Limited, Wanchai (HK)

( * ) Notice: Subject to any disclaimer, the term of this patent is extended or adjusted under 35 U.S.C. 154(b) by 83 days.

(21) Appl. No.: 14/583,377

(22) Filed: Dec. 26, 2014

(65) Prior Publication Data

US 2015/0185289 A1  Jul. 2, 2015

(30) Foreign Application Priority Data

Dec. 31, 2013  (CN) .......................... 2013 1 0752233
Sep. 30, 2014  (CN) .......................... 2014 1 0521086
Sep. 30, 2014  (CN) .......................... 2014 1 0521089
Sep. 30, 2014  (CN) .......................... 2014 1 0523174

(51) Int. Cl.
*G01R 31/36*  (2006.01)
*H02J 7/00*  (2006.01)
*G01R 31/04*  (2006.01)
*H01M 10/48*  (2006.01)

(52) U.S. Cl.
CPC ......... *G01R 31/362* (2013.01); *G01R 31/043* (2013.01); *G01R 31/3606* (2013.01); *G01R 31/3658* (2013.01); *H02J 7/0013* (2013.01); *G01R 31/3624* (2013.01); *H01M 10/482* (2013.01); *H01M 2220/30* (2013.01)

(58) Field of Classification Search
CPC .......... G01R 31/3624; G01R 19/16542; G01R 31/3606; G01R 31/362; G01R 31/3658
USPC ....................................................... 324/434
See application file for complete search history.

(56) References Cited

U.S. PATENT DOCUMENTS

| 5,432,452 | A | * | 7/1995 | Fiorina | ................ | G01R 31/362 320/151 |
| 8,571,738 | B1 | * | 10/2013 | Potter | ................... | B60L 3/0046 324/434 |
| 2012/0274335 | A1 | * | 11/2012 | Matsuura | ........... | G01R 31/3624 324/537 |
| 2013/0149572 | A1 | * | 6/2013 | Matsuo | ................... | H01M 2/34 429/61 |

(Continued)

*Primary Examiner* — Jermele M Hollington
*Assistant Examiner* — Christopher McAndrew
(74) *Attorney, Agent, or Firm* — Greenberg Traurig, LLP

(57) ABSTRACT

A battery pack, a method for detecting the battery pack, a charging assembly, and an electric tool are provided for detecting voltage and disconnection of the battery cells. The battery pack may have an output voltage of at least 56V and may include a plurality of series connection units. A voltage detecting module may be utilized for detecting voltage in the battery pack. A battery control module configured to control voltage detecting module may also be employed. The method may involve determining whether the series connection units are disconnected based on rates of voltage change or internal-resistance of the series connection units.

3 Claims, 7 Drawing Sheets

(56) References Cited

U.S. PATENT DOCUMENTS

2013/0300426 A1* 11/2013 Butzmann ............ G01R 31/362
                                                                             324/434

* cited by examiner

BATTERY PACK, METHOD FOR DETECTING BATTERY PACK, CHARGING ASSEMBLY AND ELECTRIC TOOL

CROSS REFERENCE TO RELATED APPLICATION

This application is a non-provisional application claiming priority from Chinese Patent Application No. CN201310752233.2, filed Dec. 31, 2013; Chinese Patent Application No. CN201410521089.6, filed Sep. 30, 2014; Chinese Patent Application No. CN201410523174.6, filed Sep. 30, 2014; and Chinese Patent Application No. 201410521086.2, filed Sep. 9, 2014, all of which are incorporated herein by reference in their entireties.

FIELD OF THE DISCLOSURE

The present disclosure relates to a battery pack, a method for detecting the battery pack, a charging assembly, and an electric tool.

BACKGROUND

A battery pack, as a power source of a wireless electric tool, limits the development of wireless electric tools. Battery packs typically have an output voltage below 30V, and usually lead to problems such as insufficient power and undesirable endurance upon driving large-power electric tools. Currently there is no charging assembly that has an output voltage above 30V and a circuit structure that can be safely used during charging. Likewise, currently there is no corresponding charging control method for such a charging assembly.

SUMMARY OF THE DISCLOSURE

In one aspect of the disclosure, a battery pack comprises a plurality of series connection units forming series connection, a voltage detecting module configured to detect a voltage signal of a high-voltage side of the plurality of series connection units respectively, and a battery control module configured to receive the voltage signal detected by the voltage detecting module and determine a voltage of the series connection unit, wherein each series connection unit comprises a plurality of battery cells, and the plurality of battery cells in each series connection unit are connected in parallel, wherein the battery control module is capable of determining whether disconnection of the battery cells in the series connection unit has happened according to the voltage of the series connection unit.

In one example, the battery control module comprises a disconnection detecting module configured to determine whether disconnection of the battery cells in the series connection unit has happened according to relative relationship between the voltage of the series connection unit and time.

Furthermore, the disconnection detecting module may comprise a time calculating means for providing time data, a slope calculation means configured to determine a slope of the voltage of the series connection unit relative to the time, and a determining means configured to determine whether disconnection of the battery cells in the series connection unit has happened according to the slope of the series connection unit.

In another example, the battery control module may comprise a disconnection detecting module configured to determine whether disconnection of the battery cells in the series connection unit has happened according to a determined internal-resistance of the series connection unit.

Furthermore, the disconnection detecting module may comprise a current detecting means configured to detect a current of the series connection unit, an internal-resistance calculation means configured to determine the internal-resistance of the series connection unit according to the voltage and the current of the series connection unit, and a determining means configured to determine whether disconnection of the battery cells in the series connection unit has happened according to the internal-resistance of the series connection unit.

Another example battery pack having an output voltage of at least 56V may comprise a plurality of series connection units forming series connection, a voltage detecting module configured to detect a voltage signal of a high-voltage side of the plurality of series connection units respectively, and a battery control module configured to receive the voltage signal detected by the voltage detecting module and determine a voltage of the series connection unit, wherein each series connection unit comprises a plurality of battery cells, and the plurality of battery cells in each series connection unit are connected in parallel, wherein the battery pack further comprises a disconnection detecting module configured to determine whether disconnection of the battery cells in the series connection unit has happened according to the voltage of the series connection unit.

In one example, the disconnection detecting module comprises a time calculating means for providing time data, a slope calculation means configured to determine a slope of the voltage of the series connection unit relative to the time, and a determining means configured to determine whether disconnection of the battery cells in the series connection unit has happened according to the slope of the series connection unit.

According to another example, the disconnection detecting module comprises a current detecting means configured to detect a current of the series connection unit, an internal-resistance calculation means configured to determine the internal-resistance of the series connection unit according to the voltage and current of the series connection unit, and a determining means configured to determine whether disconnection of the battery cells in the series connection unit has happened according to the internal-resistance of the series connection unit.

The above example battery packs differ from one other as to whether the disconnection detecting module is integral to the battery control module or serves as a separate module. Those having ordinary skill in the art will recognize that a wide variety of modifications may be made to the examples disclosed herein without departing from the spirit and scope of the present disclosure.

In other examples, the disconnection detecting module may be arranged outside the battery pack and detected via an external apparatus. For example, in one instance, a charging assembly may comprise a battery pack and a charger for charging the battery pack, with the battery pack comprising a plurality of series connection units forming series connection; each series connection unit comprising a plurality of battery cells, and the plurality of battery cells in each series connection unit being connected in parallel, wherein the charging assembly further comprises a voltage detecting module configured to detect a voltage signal of a high-voltage side of the plurality of series connection units respectively, a battery control module configured to receive the voltage signal detected by the voltage detecting module and determine a voltage of the series connection unit, and a disconnection detecting module configured to determine whether disconnection of the battery cells in the series connection unit has happened according to the voltage of the series connection unit.

In one example, the disconnection detecting module may be disposed in the charger. For instance, the battery pack may further comprise a battery pack communication module and a temperature module, wherein the battery pack communication module is configured to achieve data exchange between the battery pack and the charger, and the temperature module is configured to detect the temperature in the battery pack.

The battery control module may control the battery pack communication module and may constitute information interactions therewith.

In some examples, the battery pack communication module is electrically connected with the battery control module.

In some examples, the battery pack communication module comprises a battery pack communication terminal configured to connect with the charger to achieve data transmission.

In some examples, the charger comprises a charge protection circuit configured to provide protection when the battery pack is charged, as well as a charger temperature terminal electrically connected with the charge protection circuit.

In some examples, the temperature module comprises a battery pack temperature terminal; when the charger temperature terminal connects with the battery pack temperature terminal, the charge protection circuit enables the charger to charge the battery pack. When the charger temperature terminal is disconnected from the battery pack temperature terminal, the charge protection circuit enables the charger to stop charging the battery pack.

In another aspect, an example electric tool may comprise an electric device and a battery pack, where the battery pack powers the electric device. The example battery pack comprises a plurality of series connection units forming series connection, with each series connection unit comprising a plurality of battery cells, and the plurality of battery cells in each series connection unit being connected in parallel; wherein the electric tool further comprises a voltage detecting module configured to detect a voltage signal of a high-voltage side of the plurality of series connection units respectively, a battery control module configured to receive the voltage signal detected by the voltage detecting module and determine a voltage of the series connection unit, and a disconnection detecting module configured to determine whether disconnection of the battery cells in the series connection unit has happened according to the voltage of the series connection unit. In this case, the disconnection detecting module may be disposed in the electric device.

In some examples, the battery pack comprises a battery pack communication module and a temperature module, wherein the battery pack communication module is configured to achieve data exchange between the battery pack and the electric device, and the temperature module is configured to detect the temperature in the battery pack.

In some examples, the battery control module controls the battery pack communication module and constitutes information interactions therewith.

In some examples, the battery pack communication module is electrically connected with the battery control module and comprises a battery pack communication terminal configured to connect with the electric device to achieve data transmission.

In some examples, the electric device comprises a discharge protection circuit configured to provide protection when the battery pack is discharging, a device temperature terminal electrically connected with the discharge protection circuit; wherein the temperature module comprises a battery pack temperature terminal; when the device temperature terminal connects with the battery pack temperature terminal, the discharge protection circuit enables the battery pack to power the electric device; and when the device temperature terminal is disconnected from the battery pack temperature terminal, the discharge protection circuit enables the battery pack to stop powering the electric device.

Furthermore, an example method is disclosed for detecting whether a conductor between battery cells connected in parallel in the battery pack is disconnected. The battery pack may comprise a plurality of series connection units forming a series connection, and each series connection unit may comprise more than two battery cells connected in parallel. The detecting method may in one example comprise detecting a voltage signal of a high-voltage side of the series connection unit, determining a slope of the voltage of the series connection unit relative to the time, and determining whether disconnection of battery cells in the series connection unit has happened according to the slope of the series connection unit.

In other examples, the detecting method comprises detecting a voltage signal of a high-voltage side of the series connection unit, determining an internal-resistance of the series connection unit, and determining whether disconnection of the battery cells in the series connection unit has happened according to the internal-resistance of the series connection unit.

In one aspect, an example battery pack having an output voltage of at least 56V comprises a plurality of series connection units forming series connection, a voltage detecting module configured to detect a voltage signal of a high-voltage side of the plurality of series connection units respectively, and a battery control module configured to receive the voltage signal detected by the voltage detecting module and determine a voltage of the series connection unit, wherein each series connection unit comprises a plurality of battery cells, and the plurality of battery cells in each series connection unit are connected in parallel, wherein the voltage detecting module is electrically connected with the battery cell combination.

Furthermore, one example voltage detecting module comprises a detecting circuit having one end connected to the high-voltage side of the series connection unit and the other end connected to the battery control module, wherein the battery control module detects the voltage signal of the high-voltage side of the plurality of series connection units via a plurality of detecting circuits in a time-division manner.

Furthermore, one example voltage detecting module further comprises a time-division module configured to control at least two detecting circuits, wherein the battery control module, via the time-division module, enables the plurality of detecting circuits to be turned to conducting state in a time-division manner.

Furthermore, an example battery control module comprises a first microcontroller (MCU) configured to receive the voltage signal of a portion of the detecting circuits, and a second MCU configured to receive the voltage signal of another portion of the detecting circuits.

An example voltage detecting module comprises a first time-division module configured to control the plurality of detecting circuits sending the voltage signal to the first MCU to be turned to conducting state in the time-division manner, a second time-division module configured to control the a plurality of detecting circuits sending the voltage signal to the second MCU to be turned to conducting state in the time-division manner, wherein the first MCU controls the first time-division module, and the second MCU controls the second time-division module and transfers the data to the first MCU.

Furthermore, example detecting circuits sending the voltage signal to the first MCU are respectively connected to the high-voltage side of adjacent series connection units, and the detecting circuits sending the voltage signal to the second MCU are respectively connected to the high-voltage side of adjacent series connection units.

Furthermore, the number of the detecting circuits controlled by the first MCU is in some examples equal to the number of the detecting circuits controlled by the second MCU.

Furthermore, one example detecting circuit comprises an switch means configured to turn the detecting circuits to conducting state or non-conducting state when is controlled by the time-division module, wherein the switch means comprises two connection terminals enabling the switch means to connect in the detecting circuit and a control terminal for receiving a signal of the time-division module and controlling switching between the on/off states of the two connection terminals, wherein the two connection terminals comprise a detecting terminal connected to the high-voltage side of the series connection unit, and an output terminal connected to the battery control module.

Furthermore, an example detecting circuit comprises a voltage-apportionment resistor for stabilizing the voltage signal received by the battery control module in a preset range.

BRIEF DESCRIPTION OF THE DRAWINGS

The drawings appended hereto are for illustrative purposes only and show exemplary embodiments rather than all possible implementations. As such, the drawings are not intended to, and do not in any way, limit the scope of the present disclosure. Unless specified otherwise, like reference numerals indicate like parts throughout the various views.

DETAILED DESCRIPTION

The following description of example methods and apparatus is not intended to limit the scope of the disclosure to the precise form or forms detailed herein. Instead the following description is intended to be illustrative so that others may follow its teachings.

Figure 1:
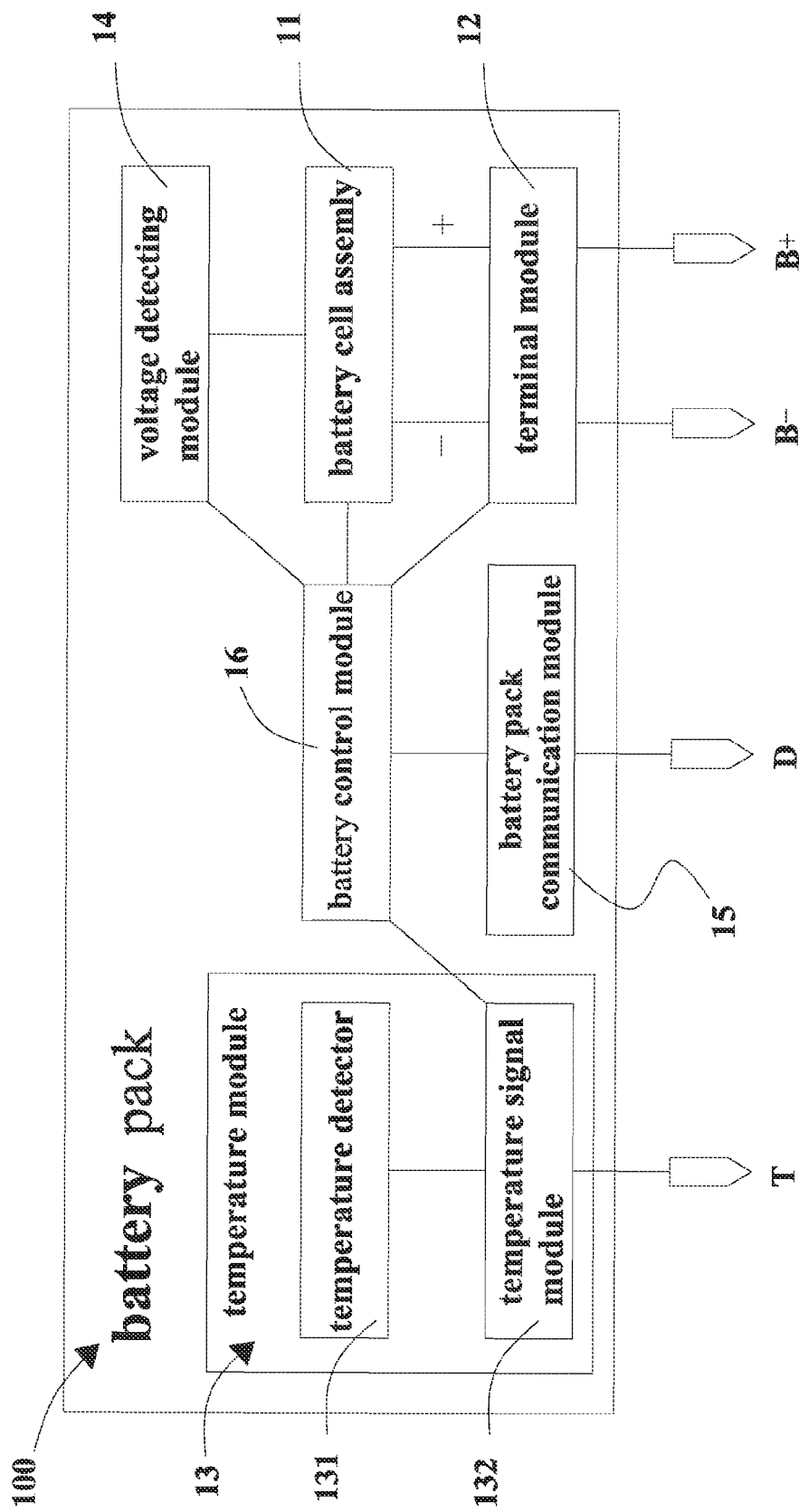
FIG. 1 illustrates a block diagram of an example of a battery pack.
Figure 2:
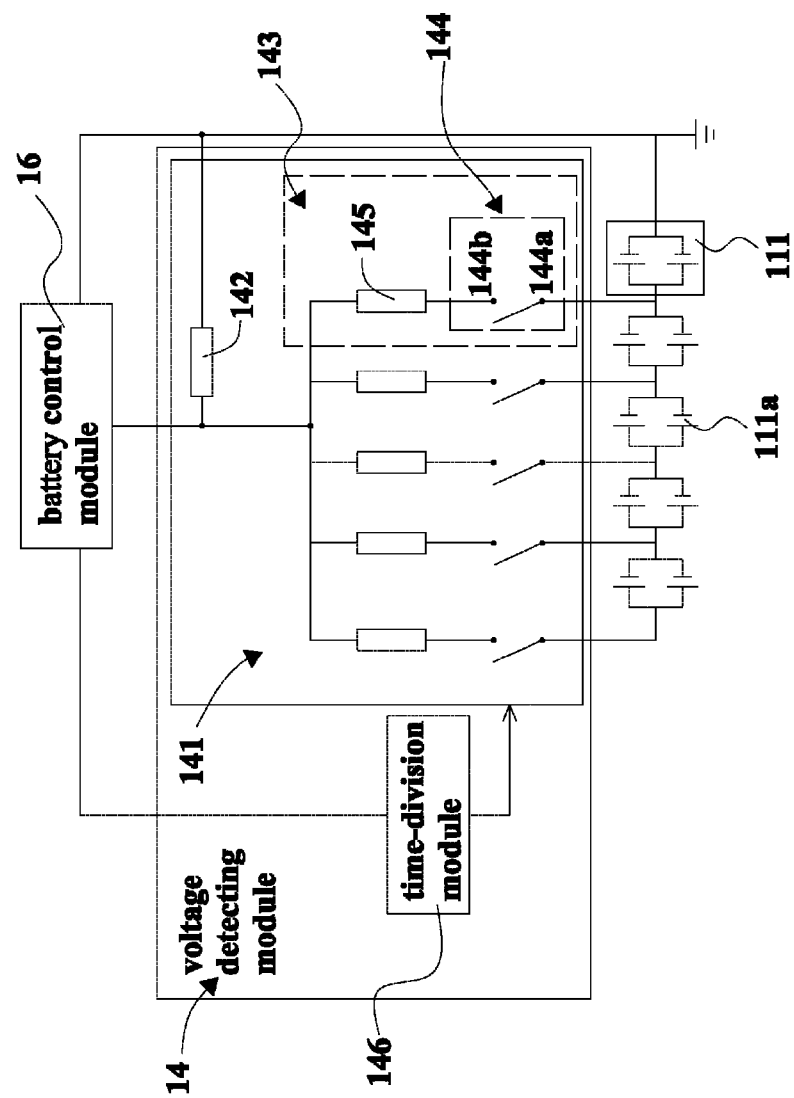
FIG. 2 illustrates a block diagram of an example of a portion of the battery pack for implementing voltage detection.
Figure 3:
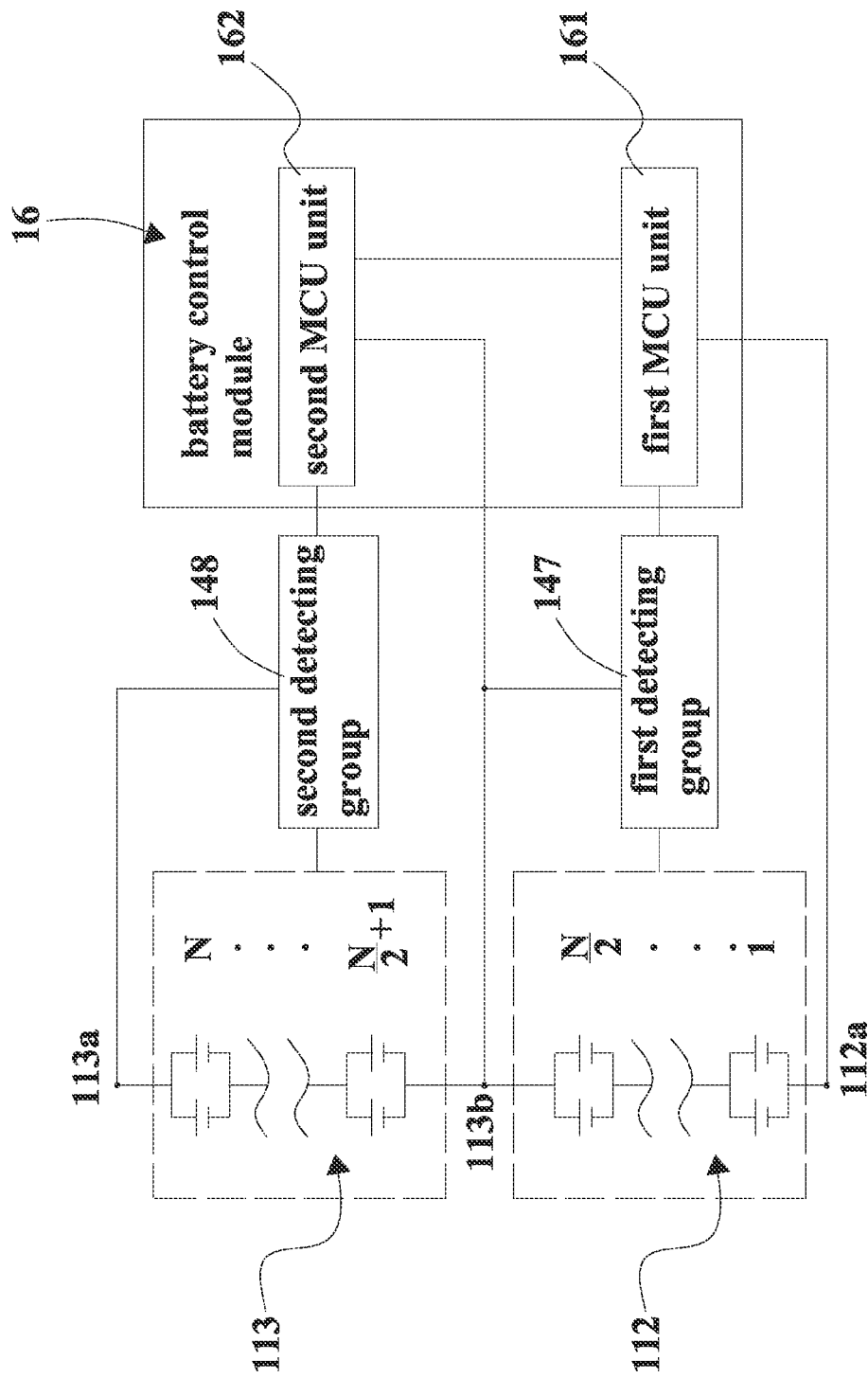
FIG. 3 illustrates a block diagram of an example of a portion of the battery pack for implementing voltage detection.

Referring to FIGS. 1-3, an example battery pack 100 in some instances comprises a battery cell assembly 11, a terminal module 12, a temperature module 13, a voltage detecting module 14, a battery pack communication module 15 and a battery control module 16 controlling them. The example battery cell assembly 11 may comprise a plurality of series connection units 111, and the series connection units 111 may be connected in series to form the battery cell assembly 11. The example series connection unit 111 comprises a plurality of battery cells 111a, and the battery cells 111a in the same series connection unit 111 may be connected in parallel.

As shown in FIG. 2 and FIG. 3, each example series connection unit 111 comprises two battery cells 111a connected in parallel. Further, the example terminal module 12 is electrically connected with the battery cell assembly 11 and the battery control module 16 respectively and provided with a battery pack positive terminal B+ and a battery pack negative terminal B− for forming electrical connection with an external apparatus to achieve electrical energy transfer. When the battery pack 100 is charged, the terminal module 12 may adjust the externally-input electrical energy to charge the battery cell assembly 11 and provide power source for other modules in the battery pack 100.

In some instances, the example temperature module 13 comprises a temperature detector 131 and a temperature signal module 132, wherein the temperature measuring module 131 is configured to detect internal temperature of the battery pack 100. More specifically, the example temperature detector 131 may be disposed adjacent to the battery cell assembly 11. The example temperature signal module 132 may be electrically connected with the temperature detector 131 and the battery control module 16 respectively and can feedback a detection result of the temperature detector 131 to the battery control module 16 and is controlled by the battery control module 16. The example temperature signal module 132 may be provided with a battery pack temperature terminal T electrically connected with an external temperature terminal. Preferably, the temperature detector 131 may be a thermistor, specially, a NTC thermistor (NTC, Negative Temperature Coefficient).

The example voltage detecting module 14 may be used to detect voltage signal of each series connection unit 111, and the voltage detecting module 14 may be electrically connected with the battery cell assembly 11 and the battery control module 16 respectively. In one example, the voltage detecting module 14 sends the voltage signal to the battery control module 16, and the battery control module 16 determines voltage of each series connection unit 111 according to the voltage signal.

Further, the example battery pack communication module 15 may be used to achieve data or signal exchange and may form an electrical connection with the battery control module 16. The battery pack communication module 15 may utilize hardware connections to achieve data transmission and/or employ wireless connections to achieve wireless data transmission. Since in some instances the battery pack 100 has a relatively high output voltage, reliability of communication connection needs to be ensured when the battery pack 100 is connected to a charger. Therefore, in such instances, the battery pack communication module 15 achieves data transmission by employing hardware connections. Specifically, the battery pack communication module 15 may be provided with a battery pack communication terminal D. When the battery pack 100 is assembled with a charger or an electric tool, the battery pack communication terminal D can form connection with the corresponding terminals in the charger or the electric tool.

The example battery control module 16 may be used primarily to perform functions such as logical operation and procedure control, and can also control modules in the battery pack 100 to enable the battery pack 100 to be charged or discharged safely.

In some examples, the example battery pack 100 further comprises a battery electricity display module (not shown) electrically connected with the battery control module 16, and the battery electricity display module is configured to display the remaining electricity of the battery pack 100. The example battery pack 100 may have an output voltage of at least 56V when battery cells are fully charged. As one having ordinary skill in the art will recognize, when battery pack 100 is discharged the output voltage of the 100 is decreased.

In some examples, the battery pack 100 has an electrical energy capacity greater than 100 Wh.

In some examples, the battery pack 100 comprises 14 series connection units 111. Each series connection unit 111 may comprise one or two battery cells 111a, and each battery cell 111a is provided with a nominal voltage of 4V. When the battery cells are fully charged, the battery pack 100 has an output voltage equal to 56V.

Furthermore, the voltage detecting module 14 may be used to respectively detect the voltage signal of the high-voltage side of the plurality of series connection units.

In some examples, the voltage detecting module 14 comprises a plurality of detecting circuits 143 for detecting a plurality of series connection units 111. In some examples, one end (or a "first end") of the detecting circuit 143 is connected to the high-voltage side of the series connection unit 111, and the other end (or a "second end") is connected to the battery control module 16.

If the example battery control module 16 receives the voltage signal of the plurality of detecting circuits 143 at the same time, the battery control module 16 should have an MCU with many signal interfaces or a plurality of MCUs with one signal interface. The MCU with many signal interfaces is expensive, and the number of signal interfaces should be greater than the number of detecting circuits 143. The plurality of MCUs are more expensive and take up more space. An MCU has high processing frequency.

In one example, with reference to FIG. 2, an example detecting group 141 comprises a plurality of detecting circuits 143 that are connected to the battery control module 16 through a common conductor. The example detecting group 141 further comprises a time-division module 146 for controlling switching between on/off states of the detecting circuits 143 in a time-division manner.

The example time-division module 146 enables the plurality of detecting circuits 143 of one detecting group 141 to use one conductor in a time-division manner. Thus the plurality of detecting circuits 143 of one detecting group 141 enable use of an MCU with a signal interface by sending the voltage signal of the detecting circuits 143 in separate time periods.

Moreover, the plurality of detecting circuits 143 and the time-division module may in some examples be peripheral circuits of an MCU, as they can be configured according to the number of the series connection units 111.

The example time-division module 146 may be electrically connected with the battery control module 16, and the battery enables module 16 may control the plurality of detecting circuits 143 to operate in a conducting state in a time-division manner by controlling the time-division module 146.

In some instances, one example detecting circuit 143 comprises a switch means 144. The example switch means 144 comprises two connection terminals enabling the switch means to connect in the detecting circuit 143, and a control terminal for receiving a signal of the time-division module 146 and controlling switching between on/off states of the two connection terminals, wherein the two connection terminals comprise a detecting terminal 144a connected to the high-voltage side of the series connection unit 111, and an output terminal 144b connected to the battery control module 16.

Referring to FIG. 2, in some examples the plurality of switch means 144 of one detecting group 141 connect to the same interface of an MCU. Further, in some cases the example detecting circuit 143 comprises a voltage-apportionment resistor 145 for stabilizing the voltage signal received by the battery control module 16 in a preset range.

The time-division module 146, under the control of the battery control module 16, may enable all switch means 144 in one detecting group 141 to be operated in a conducting state and then turned off in a time-division manner. In some instances, when one switch means 144 is turned on, the remaining switch means 144 are all in an OFF state to ensure that only one switch means 144 in one detecting group 141 is turned on each time period. The time-division module 146 can further control the "ON" duration of an individual switch means 144 and time switch interval for turning on different switch means 144.

Still referring to FIG. 2, the battery control module 16 may control the time-division module 146 to enable the switch means 144 to be turned to a conducting state and then turned off in a time-division manner. Switching may begin with the detecting circuit 143 located on the low-voltage side (the right side in FIG. 2). Further, switching each time enables a total voltage-apportionment resistor 142 to connect in series with different voltage-apportionment resistors 145 and constitute a loop with a different number of series connection units 111. Using FIG. 2 as an example, when the example switch means 144 located on the rightmost side is turned on, the series connection unit 111 located on the rightmost side may upload its own voltage on the total voltage-apportionment resistor 142 and the voltage-apportionment resistor 145 on the rightmost side. At this time, the battery control module 16 may determine the voltage of the series connection unit 111 on the rightmost side by detecting the voltage of the total voltage-apportionment resistor 142 (since the resistance values of both the total voltage-apportionment resistor 142 and the voltage-apportionment resistors 145 are both constant parameters).

Upon completion of the detection action, the battery control module 16 may control the time-division module 146 to switch action, and then the switch means 144 on the rightmost side is turned off and the second switch means 144 on the right side is turned on. At this point, the total voltage-apportionment resistor 142 is connected in series with the second switch means 144 on the right side, and the series connection unit 111 on the rightmost side and the second series connection unit 111 on the right side upload their respective voltage on the total voltage-apportionment resistor 142 and voltage-apportionment resistor 145 on the right side. At this time, the battery control module 16 again, by detecting the voltage of the total voltage-apportionment resistor 142, may determine a sum of the voltage of series connection unit 111 on the rightmost side and the second series connection unit 111 on the right side, then subtracts the previously-measured voltage of the series connection unit 111 on the rightmost side to obtain the voltage of the second series connection unit 111 on the right side. By the above method, the switch means 144 in respective detecting circuits 143 are switched in turn and corresponding determinations are made. As such, all series connection units 111 can be monitored. Different resistance values may be allocated to different voltage-apportionment resistors 145 so that when uploading a different number of series connection units 111, the voltage allocated to the voltage-apportionment resistor 142 is constant in a certain range as much as possible. In this way, the voltage signal inputted to the battery control module 16 is relatively stable and will not cause unnecessary interference.

In some examples, the switch means 144 may be an element such as triode or field effect transistor.

As describe above, in order to achieve a higher output voltage and have a larger electrical energy capacity, the example battery pack 100 may include a larger number of series connection units 111. Therefore, if only one logical operation unit is disposed in the battery control module 16, as may be the case in some examples, a higher clock frequency may be needed upon performing the voltage detecting, which undoubtedly increases energy consumption and increases time period of the voltage detecting.

As shown in FIG. 3, the voltage detecting module 14 in one example comprises a first detecting group 147 and a second detecting group 148. The battery control module 16 may comprise a first MCU 161 and a second MCU 162 which can respectively detect the first detecting group 147 and the second detecting group 148 and are electrically connected therewith.

The first MCU 161 may comprise an MCU chip with a strong operation capability and a higher clock frequency. Relatively speaking, since the second MCU 162 may only implement detection and transmit the detection result to the first MCU 161 for processing in one example, it employs a MCU chip with an ordinary operation capability, whereby quick detection can be achieved and the first MCU 161 chiefly in charge of the control needn't process too much data.

In some example, moreover, the number of the series connection units 111 is an even number and they are divided into a first detecting segment 112 and a second detecting segment 113 which can be detected respectively by the first detecting group 147 and the second detecting group 148. In such an example, the first detecting segment 112 and the second detecting segment 113 respectively comprise N/2 continuous series connection units 111. A low-voltage side of the battery cell assembly 11 may be a low-voltage side 112a of the first detecting segment 112, and the high-voltage side of the battery cell assembly 11 is a high-voltage side 113a of the second detecting segment 113.

As such, the plurality of series connection units 111 may in some examples be equally divided into two groups in a way that the first MCU 161 and the second MCU 162 respectively perform detection for them. Noticeably, when the first MCU 161 and the second MCU 162 perform voltage collection, zero potential points of the MCU chips should be respectively connected with the lowest potential points 112a, 113b in the series connection units 111 to be detected by the first MCU 161 and the second MCU 162 respectively.

In some cases, function modules that have the function as the voltage detecting module and the battery control module described above may be disposed in a charger or an electric device that are adapted to a battery pack with a plurality of connection units.

Figure 4:
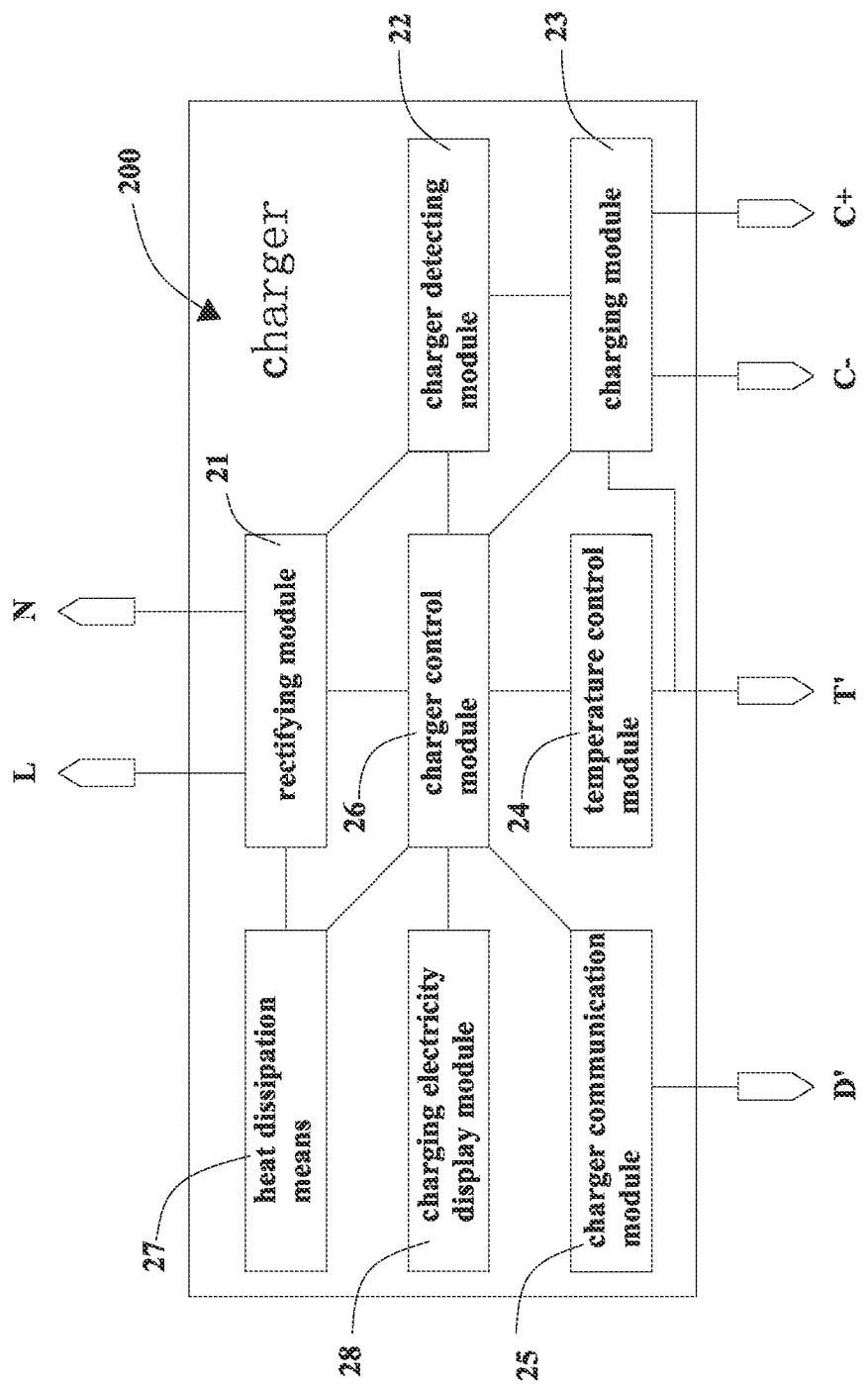
FIG. 4 illustrates a block diagram of an example of a charger.

Referring now to FIG. 4, an example charger 200 may comprise a rectifying module 21, a charger detecting module 22, a charging module 23, a temperature control module 24, a charger communication module 25 and a charger control module 26 controlling them and forming electrical connection therewith. The rectifying module 21 may be provided with power source terminals L, N which are configured to connect with an external power source and introduce AC current as a power source of the charger. The rectifying module 21 can convert the introduced AC current to electrical energy suitable for various portions of the charger 200, for example, the rectifying module 21 converts the AC current to DC current for use by the charger control module 26 and the charging module 23. Preferably, the rectifying module 21 comprises an EMC circuit and an LLC circuit.

The example charger detecting module 22 can be respectively connected with the rectifying circuit 21 and the charging module 23, and the charger detecting module 22 may serve as a bridge between the rectifying module 21 and the charging module 23. The rectifying module 21 can, via the charger detecting module 22, transfer the electrical energy to the charging module 23 and meanwhile detect electrical energy parameters of the charging module 23 to feed them back to the charger control module 26.

The charging module 23 may be provided with a charger positive terminal C+ and a charger negative terminal C−, which are used for outputting charging electrical energy and respectively electrically connected with the battery pack positive terminal B+ and battery pack negative terminal B− of the battery pack 100 when the charger 200 charging the battery pack 100.

The temperature control module 24 may be electrically connected with the charging module 23 and can perform temperature detection for the charging module 23 and the battery pack 100 connected to the charger 200. Specifically, the temperature control module 24 may be provided with a charger temperature terminal T'. In some example, the charger temperature terminal T is connected with the battery pack temperature terminal T when the battery pack positive terminal B+ of the battery pack 100 forms connection with the battery pack negative terminal B−. As such, the temperature control module 24 may obtain data of the internal temperature of the battery pack 100 via the temperature detector 131 in the battery pack 100, and then feed the data or the signal back to the charger control module 26 as a basis for the charger control module 26 to control the charging procedure.

In some examples, the recharger 200 further comprises a heat dissipation means 27 and a charging electricity display module 28 electrically connected with the charger control module 26, and the charging electricity display module 28 is used to indicate how much power has already been charged by the charger 200 to the battery pack 100, wherein the heat dissipation means 27 is used to perform forced heat dissipation for the charger 200 or battery pack 100 via air flow when the charger 200 or the battery pack 100 being charged is at a higher temperature. More specifically, the heat dissipation means 27 can in some cases be an electrical fan that comprises a motor and fan blades (not all shown in the figures), wherein the motor drives the fan to rotate, and the charger control module 26 adjusts a rotation speed of the motor by adjusting a duty cycle of the driving motor so as to control heat dissipation intensity. Battery pack 100 may control the heat dissipation means 27 by the communication with the charger 200.

The charger communication module 25 is provided with a charger communication terminal D' in some examples. Upon charging, the battery pack communication terminal D of the battery pack 100 forms connection therewith so that the charger control module 26 in the charger 200 performs data interaction or signal interaction with the battery control module 16 of the battery pack 100.

Figure 5:
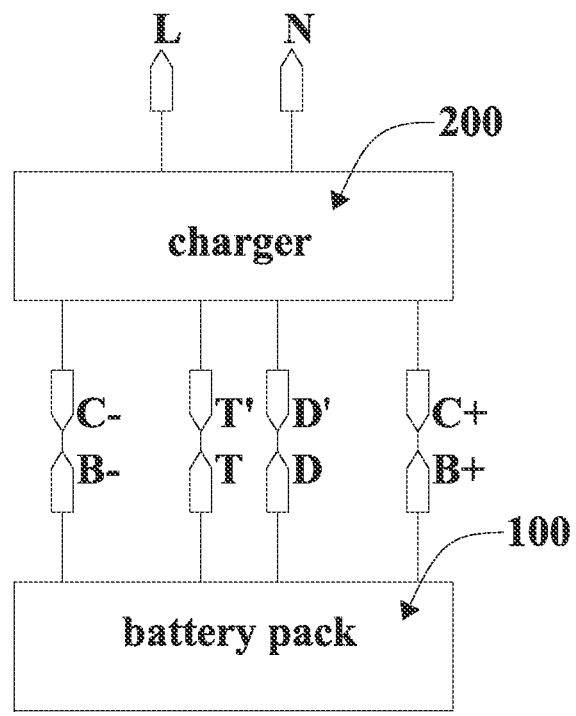
FIG. 5 illustrates a block diagram of an example of a charging assembly.

As shown in FIG. 5, the charging assembly 300 may generally comprise the battery pack 100 and the charger 200 described above. To achieve security protection upon charging, the charger 200 may further comprise a charge protection circuit (not shown). The charge protection circuit can be electrically connected with the charger temperature terminal T' and the charging module 23 respectively. The charge protection circuit can determine whether the charger 200 connect to the battery pack 100 by detecting a voltage signal of the charger temperature terminal T'. When the charger 200 is not connected to the battery pack 100, the charge protection circuit may stop the charging process.

In terms of hardware control, the charger protection circuit may directly control the charging module 23 according to different potential signals when the charger temperature terminal T' is connected or disconnected with the temperature detector 131. This is advantageous in that when the battery pack 100 is not inserted in place, the charger 200 is ensured by hardware, so it does not enable the charger positive terminal C+ and charger negative terminal C− charged and thereby ensures safe use. Meanwhile, this control can reuse the charger temperature terminal T' and saves costs.

Further, in some instances, the charger control module 26 of the charger 200 is electrically connected with the charger temperature terminal T'. When the battery pack 100 is inserted in place, the charger control module 26 detects the voltage of the charger temperature terminal T' and then triggers the charging procedure of the charger control module 26. When not detecting the charger temperature terminal T', the charger control module 26 may activate a software protection program. In this way, the charger 200 ensures secure charging in two aspects—with respect to hardware and software.

An example charge control method is introduced below based on the above-mentioned battery pack 100, the charger 200, and the resultant charging assembly 300. In general, the control method provides protection in two aspects, wherein one aspect is charging protection as described above, which is summarized again as the following technical solution: upon detecting that the battery pack 100 has already been connected, the charger control module 26 activates the charge protection program to control the charging module 23, and the charger temperature terminal T' is electrically connected to the charging module 23 to form hardware protection; when the charger temperature terminal T' is disconnected from the batter pack temperature terminal T, the charging module 23 closes the electrical energy output of the charger positive terminal C+ and the charger negative terminal C−.

In another aspect, however, the control method may comprise a method of activating the battery control module 16 when the battery control module 16 does not have enough power to feed back information to the charger control module 26 of the charger 200 after the battery pack 100 is over-discharged. Since the battery pack 100 and the charger 200 are characterized by large voltage and large power, charging in the turn-off state of the battery control module 16 is very dangerous, and it is very necessary to activate it in the event of over-discharge of the battery pack 100. Specifically, the example activating method can be described as follows: when the charger control module 26 of the charger 200, by detecting the voltage of the charger temperature terminal T', detects that the battery pack 100 has already been connected but the charger communication module 25 does not receive the communication information of the battery pack communication module 15, the charger control module 26 controls the charging module 23 to activate and charge the battery pack 100 until the battery control module 16 and battery pack communication module 15 of the battery pack 100 restore to a normal state so that the charger communication module 25 receives communication information of the battery pack communication module 15 or reaches an upper limit of activation time.

According to some examples, upon activation, activation and charging do not occur immediately after the communication information is not received, but may activate and charge if the communication information is never detected in a preset range of time. A smaller constant current is used for charging upon activation and charging. For example, the current may be in a range of 0.01 C to 0.1 C. Certainly, a small-current pulse may be used for charging in some cases. By way of example, a width of the pulse may be 10 ms, and a cycle may be 1 s.

In addition, the following two aspects may be taken into account upon stopping activation and charging. First, the battery pack 10 can already operate normally after activation and charging, whereupon activation and charging should still be continued for a period of time to ensure the electricity of the battery pack 100 enough for transition to a formal charging phase. Therefore, in one example, after the battery control module 16 and the battery pack communication module 15 of the battery pack 100 return to normal to allow the charger communication module 15 to receive the communication information of the battery pack communication module 15, the charger control module 26 still controls continued activation and charging of the charging module 23 within a preset period of time. The preset period of time is preferably 10 to 30 seconds. Certainly, it may also be feasible to use the voltage of the battery pack 100 as a trigger signal for stopping activation. Secondly, if the battery pack 100 were to fail, it is unlikely to resume normal operation even after activation and charging, so activation and charging cannot be performed infinitely. In one case, the example charger control module 26 of the charger only performs activation and charging one time after detecting that the battery pack 100 has already been connected very time, and activation and charging each time has an upper limit of activation time, e.g., 2 to 5 minutes.

Figure 6:
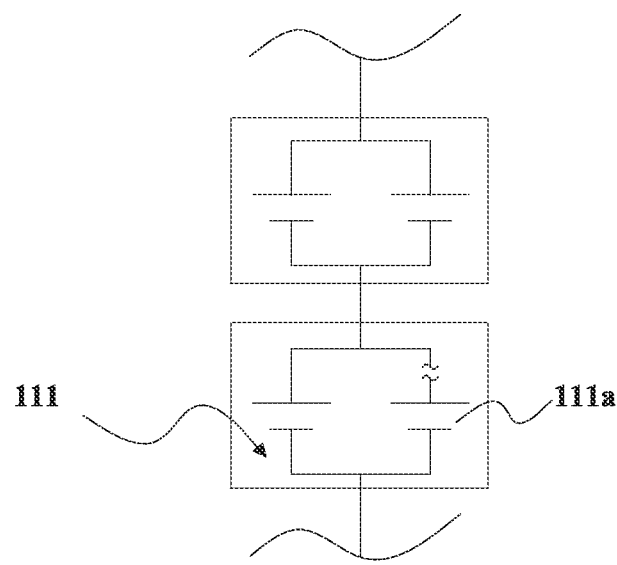
FIG. 6 is a schematic view of disconnection of a series connection unit.
Figure 7:
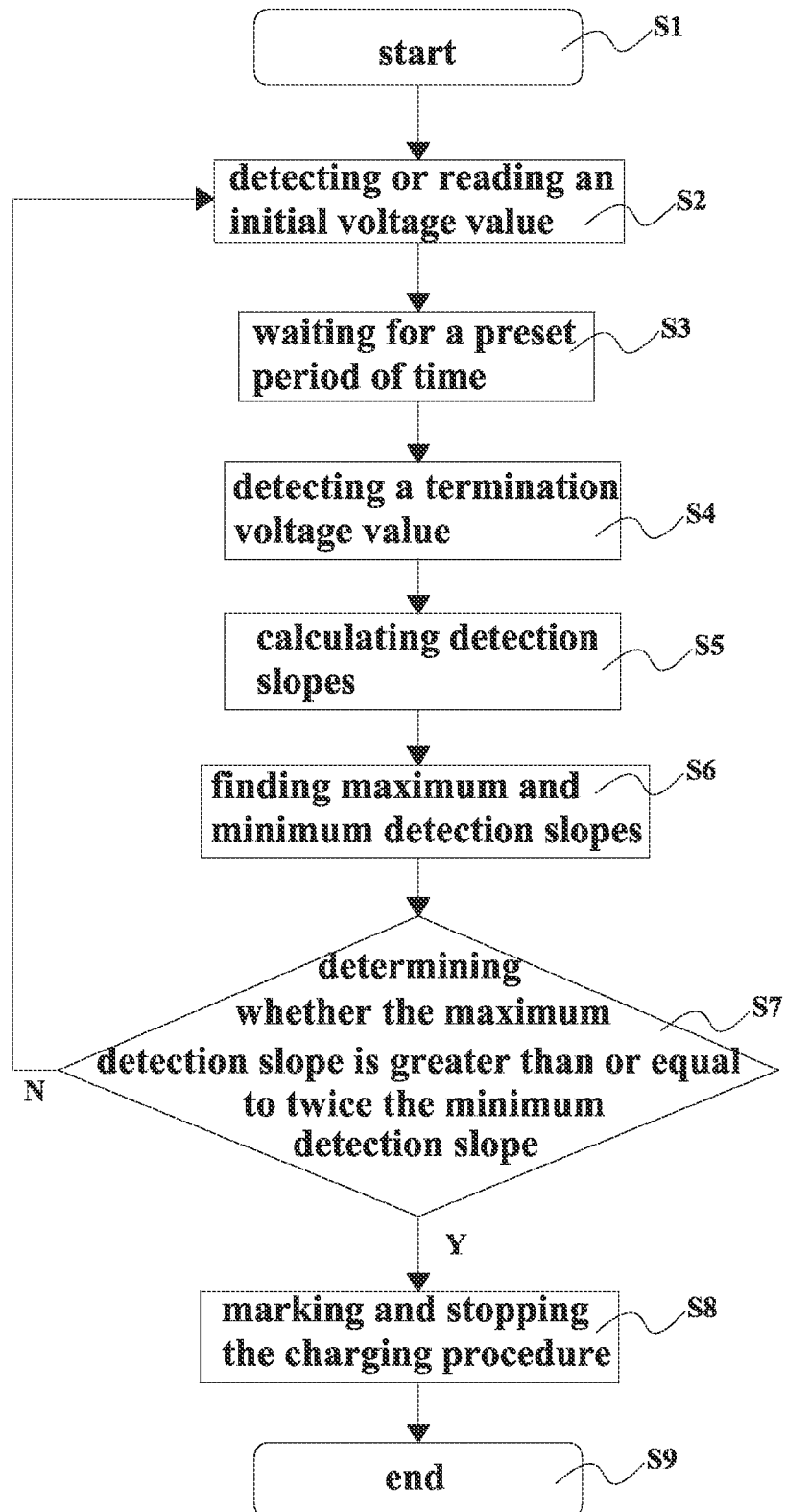
FIG. 7 is a block diagram showing specific steps of a battery pack detecting method.

Referring to FIG. 6, in the example battery pack 100, if a series connection unit 111 has a plurality of battery cells 111a connected in parallel, it may be difficult or even impossible to determine, by detecting the voltage value, whether a disconnection fault has occurred and which one of the series connection units 111 fails even if one of the battery cells 111a is disconnected. As such, upon occurrence of disconnection, a risk may be present if charging is performed according to the original charging procedure.

To solve this problem, the example battery pack 100 further comprises a disconnection detecting module (not shown) that can determine whether the battery cells in the series connection unit(s) have been disconnected based on the voltage of the series connection unit(s). The example disconnection detecting module may serve as part of the battery control module 16 or serve as an independent function module independent from the battery control module. To detect disconnection of the battery cell, the disconnection detecting module may perform detection according to a relationship between the voltage of the series connection unit 111 and time, or based on the change of the internal-resistance of the series connection unit 111.

As one example solution, the disconnection detecting module may comprise a time calculating means for providing time data (e.g., a clocked input), a slope calculation means configured to determine a slope of the voltage of the series connection unit relative to time, and a determining means configured to determine whether disconnection of battery cells in the series connection unit has occurred based on the slope of the series connection unit.

As another example solution, the disconnection detecting module comprises a current detecting means configured to detect a current of the series connection unit; an internal-resistance calculation means configured to determine the internal-resistance of the series connection unit according to the voltage and current of the series connection unit; and a determining means configured to determine whether disconnection of battery cells in the series connection unit has occurred according to the internal-resistance of the series connection unit.

Besides, when the example battery pack 100 and a charger form a charging assembly, the disconnection detecting module in the above solution may be disposed in the charger, and the disconnection detecting module may obtain desired data or signals when the battery pack 100 is connected with the charger. In addition, when the battery pack 100 and an electric device form an electric tool, the disconnection detecting module in the above solution may be disposed in the electric tool, and the disconnection detecting module may obtain desired data or signals when the battery pack 100 is connected with the electric device. The electric device may be either an electric device having a motor or a measuring device such as a laser range finder. The charger and the electric device should, at least in some examples, also have a control module (not shown) for controlling the disconnection detecting circuit.

When detection is performed according to a relationship between the voltage of the series connection unit 111 and time, the example disconnection detecting method comprises detecting a voltage signal of a high-voltage side of the series connection unit, determining a slope of the voltage of the series connection unit relative to time, and determining whether disconnection of battery cells in the series connection unit has happened according to the slope of the series connection unit.

As shown in FIG. 6, when disconnection of the example battery cell 111a in the series connection unit 111 occurs, the electricity through the series connection units 111 may be the same because the series connection unit 111 is connected in series with the remaining series connection units 111. Due to the disconnection of the battery cell 111a, the slope of the voltage relative to time is likely different from that of other normal series connection units 111.

In practical detection, the slope of each series connection unit 111 may be compared with an average of the slope of all series connection units, or compared with a preset range of slope value.

Preferably, regarding examples in which the series connection unit 111 comprises two battery cells 111a connected in parallel, the example method may comprise the following steps:

S1: start;
S2: detecting or reading an initial voltage of all series connection units;
S3: waiting for a preset period of time;
S4: detecting a termination voltage of all series connection units;
S5: determining a slope of the voltage of the series connection unit 111 relative to time respectively by the voltage values obtained in the two times of detection;
S6: finding maximum and minimum detection slopes;
S7: determining whether the maximum detection slope is greater than or equal to twice the minimum detection slope, proceeding to step S8 if yes, and returning to S2 if no;
S8: marking a series connection unit 111 with the maximum detection slope, the system reporting an error, and stopping the charging procedure, and turning to step S9;
S9: end.

Noticeably, specific judgment conditions in step S7 may depend on specific situations of the series connection units 111, for example, when the series connection units 111 have three battery cells 111a connected in parallel, judgment of the slopes of one disconnected battery cell or two disconnected battery cells needs to be further refined. In addition, the flow returns from step S7 to step S2, and the termination voltage measured in step S4 may be regarded as an initial voltage obtained by step S2 next time. As such, one time of voltage detection action may be reduced, and energy consumption be reduced.

Upon detection according to the internal-resistance of the series connection unit 111, the disconnection detecting method may comprise detecting a voltage signal of a high-voltage side of the series connection unit 111; determining an internal-resistance of the series connection unit 111; and determining whether disconnection of battery cells in the series connection unit 111 has occurred based on the internal-resistance of the series connection unit 111.

When a disconnected battery cell 11a occurs in a series connection unit 111, the internal-resistance of the series connection unit 111 that can be reflected may be different from those of other normal series connection units 111. When no current flows through the series connection unit 111, the voltage $U1$ of the high-voltage side of the series connection unit 111 may be detected, whereupon since the current is very small, nearly zero, the internal resistance in the series connection unit 111 does not generate voltage. At this time, the detected voltage $U1$ may be almost equal to an actual voltage of the battery cell 111a.

The example series connection unit 111 may be enabled to charge or discharge so that the current with a magnitude $I$ passes through the series connection unit 111, whereupon the voltage $U2$ of the high-voltage side of the series connection unit 111 is detected. At this time, as the current passes, the voltage generated by the internal resistance of the series connection unit 111 is $IR$. Assume that $U2$ is smaller than $U1$, $U1=U2+IR$. According to that formula, then, the internal-resistance $R$ of the series connection unit 111 can be determined. If a battery pack in the series connection unit 111 is disconnected, for example, as shown in FIG. 6, the determined internal resistance $R$ at this time should be about twice that of other normal series connection units 111 if one of the two battery cells 111a is connected in parallel and the series connection unit 111 is disconnected.

According to the above example method, detection of disconnection may be achieved in some examples by detecting the voltage and the current value, then determining the internal-resistance of the series connection unit 111, and then determining whether the internal-resistance values is abnormal. The determination may be performed according by comparing the internal-resistances in all series connection units 111. For example, the maximum internal-resistance may be compared with an average of the remaining internal-resistance values, and the maximum internal-resistance may be compared with a preset range of data. The former comparison is advantageous in that judgment may be made along with changes of temperature and actual situations in dynamic detection, and the latter comparison is advantageous in smaller data operation quantity, but disadvantageous in possible inaccuracy when the internal resistance changes substantially.

Figure 8:
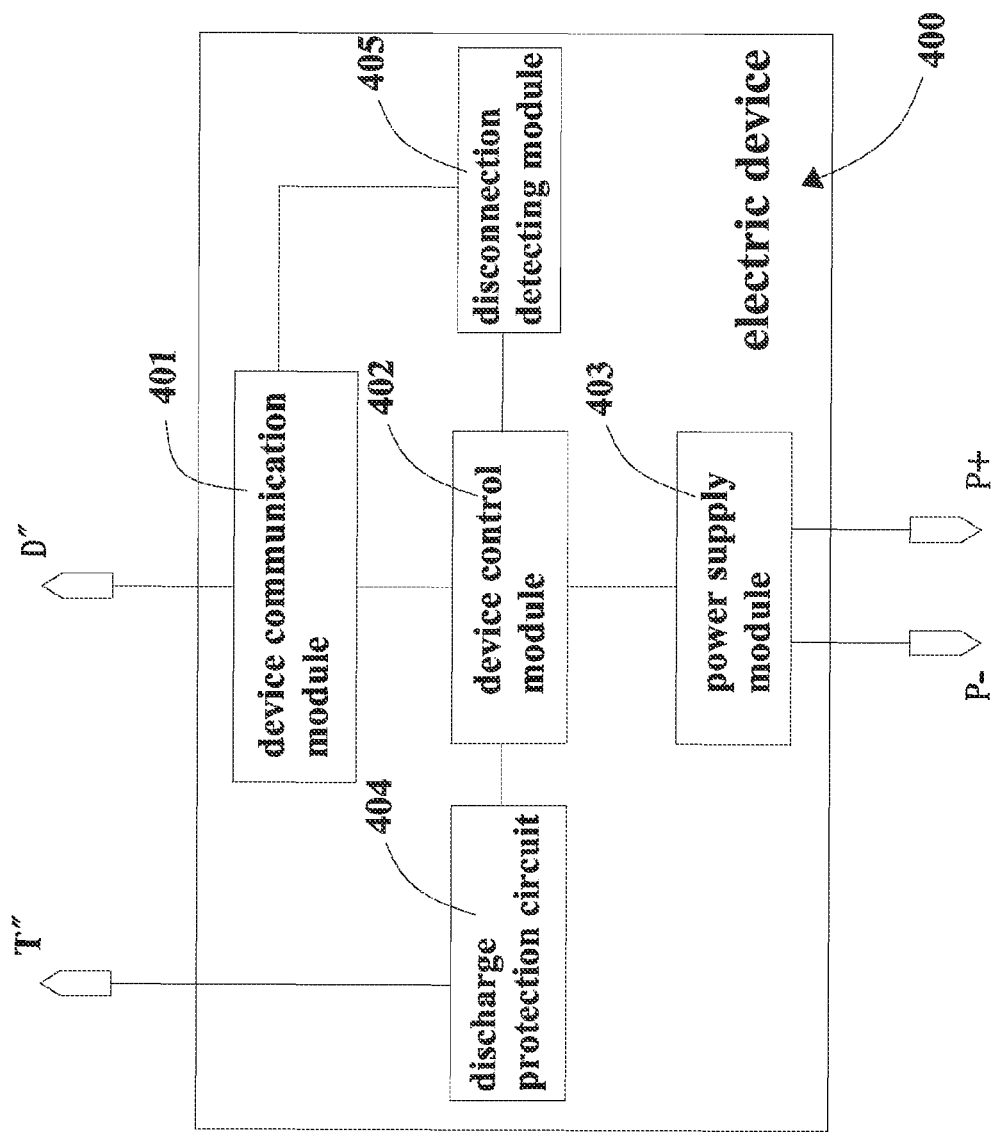
FIG. 8 is a block diagram of an example of an electric device in an electric tool.

The following description introduces an example electric tool comprising a battery pack 100 and an electric device 400. The example electric device 400 (as shown in FIG. 8) in the electric tool comprises a device communication module 401, a Device control module 402, a power supply module 403, a discharge protection circuit 404, and a disconnection detecting module 405. The example device communication module 401 may have a tool communication terminal D" configured to form communication connection with the battery pack communication terminal D in the battery pack. The Device control module 402 may control the device communication module 401. The power supply module 403 may be connected with a tool positive pole P+ and a tool negative pole P− for connecting with the battery pack positive terminal B+ and battery pack negative terminal B− respectively to achieve electrical energy transmission.

The discharge protection circuit 404 can be used to provide security discharging of battery pack 100 and comprises a device temperature terminal T" for connection with the battery pack temperature terminal T. When the device temperature terminal T" is disconnected from the battery pack temperature terminal T, or the temperature of battery pack 100 is too high, for example, the discharge protection circuit 400 can prevent the battery pack from supplying power to the electric device 400.

After receiving data sent from the battery pack via the battery pack communication module, the Device control module 402 may check the correctness of individual data packet through CRC cycle. If the check shows that the data is wrong, the current data packet may be automatically abandoned, and the Device control module 402 may wait to receive the next data packet. If there is no valid data packet received in a preset period time, the Device control module 402 may in some cases enter a protection waiting procedure, and operation of the electric tool may be stopped and/or prevented.

After receiving a valid data packet, the Device control module 402 may relay data back to the battery control module. If the battery control module does not receive data feed back from the Device control module 402, the battery control module may continue to send data packets and detect whether the battery pack is disconnected from the electric device 400. After determining that the received data packet sent from the battery control module is invalid, the Device control module 402 may begin to keep time. If the Device control module 402 receives a valid data packet sent from the battery control module during time keeping, the time keeping of the Device control module 402 is reset. After receiving a valid data packet, the Device control module 402 enters a normal operation procedure. Likewise, the example charger 200 and the example battery pack 100 may also employ the same hardware configuration and data fault-tolerance method as the electric device 400.

Noticeably, since the example battery pack 100 has higher output voltage and electrical energy capacity, it may generate a considerable amount of heat during charging and discharging. In order to ensure proper operation of the battery pack 100, the charge protection and discharge protection of the battery pack 100 may be respectively implemented in the charger 200 and electric tool connected therewith.

Besides the above-described solutions, when the example battery pack 100 is connected with a corresponding electric tool (not shown) and supplies power to it, in order to enable the Device control module 402 in the electric tool to determine whether the battery pack 100 has under voltage as quickly as possible, the battery control module 16 of the battery pack 100 may compare voltages of adjacent series connection units 111, select a smaller one of them, regard all smaller voltage values selected from two adjacent series connection units 111 as objects of comparison, and then send a minimum voltage among them to the electric tool as a basis for determining the undervoltage state. In this way, data transmission amount is substantially reduced and efficiency is increased.

The above description and appended figures illustrate and describe basic principles, main features, and advantages of the present disclosure. Those skilled in the art should appreciate that the above embodiments do not limit the present disclosure in any form. Technical solutions obtained by equivalent substitution or equivalent variations all fall within the scope of the present disclosure.

What is claimed is:

1. A battery pack comprising:
   a plurality of series connection units connected in series, each of the plurality of series connection units comprising a plurality of battery cells, the plurality of battery cells in each of the plurality of series connection units connected in parallel;
   a voltage detector that detects a voltage signal of a high-voltage side of each of the plurality of series connection units; and
   a battery controller that receives the voltage signal detected by the voltage detector and determines a voltage of each of the plurality of series connection units,
   wherein the battery controller determines whether the plurality of battery cells in each of the plurality of series connection units has been disconnected based on the change of voltage of each of the plurality of series connection units, by determining a time based slope in the change of the voltage of each of the plurality of series connection units and determining whether the plurality of battery cells in each of plurality of series connection units has been disconnected based on the determined slope of each of the plurality of series connection units.

2. The battery pack of claim 1, wherein the battery controller further determines whether the plurality of battery cells in each of the plurality of series connection units has been disconnected based on an internal-resistance of each of the plurality of series connection units.

3. The battery pack of claim 2, wherein the battery controller detects
   a current of each of the plurality of series connection units;
   calculates the internal-resistance of each of the plurality of series connection units based on the voltage and the current of each of the plurality of series connection units; and determines whether the plurality of battery cells in each of the plurality of series connection units has been disconnected based on the internal-resistance of each of the plurality of series connection units.

* * * * *